United States Patent
Granata

(10) Patent No.: US 7,983,625 B2
(45) Date of Patent: Jul. 19, 2011

(54) NOTCH FILTER AND APPARATUS FOR RECEIVING AND TRANSMITTING RADIO-FREQUENCY SIGNALS INCORPORATING SAME

(75) Inventor: Angelo Granata, Syracuse (IT)

(73) Assignee: ST-Ericsson SA, Geneva (CH)

( * ) Notice: Subject to any disclaimer, the term of this patent is extended or adjusted under 35 U.S.C. 154(b) by 0 days.

(21) Appl. No.: 12/762,203

(22) Filed: Apr. 16, 2010

(65) Prior Publication Data

US 2010/0201438 A1    Aug. 12, 2010

Related U.S. Application Data

(63) Continuation of application No. 11/539,569, filed on Oct. 6, 2006, now Pat. No. 7,702,294.

(30) Foreign Application Priority Data

Oct. 12, 2005   (EP) ..................................... 05425715

(51) Int. Cl.
*H04B 1/44* (2006.01)
(52) U.S. Cl. .............. 455/78; 455/20; 455/85; 455/307; 327/552; 327/554; 327/427; 333/202; 333/206; 333/175
(58) Field of Classification Search ............... 455/78, 455/20, 85, 307; 327/552, 427; 333/175, 333/206, 202; 345/175
See application file for complete search history.

(56) References Cited

U.S. PATENT DOCUMENTS

| | | | | |
|---|---|---|---|---|
| 4,517,602 A | * | 5/1985 | Murphy et al. | 348/738 |
| 4,598,252 A | * | 7/1986 | Andricos | 330/51 |
| 4,945,311 A | * | 7/1990 | Smith | 327/553 |
| 5,140,703 A | * | 8/1992 | Payne | 455/226.1 |
| 5,148,121 A | * | 9/1992 | Uchida | 330/295 |
| 5,349,254 A | * | 9/1994 | Sakarya | 327/46 |
| 5,604,460 A | * | 2/1997 | Sehrig et al. | 330/51 |
| 5,834,975 A | * | 11/1998 | Bartlett et al. | 330/278 |
| 5,861,776 A | * | 1/1999 | Swanson | 330/124 R |
| 5,912,582 A | * | 6/1999 | Pisati et al. | 327/551 |
| 5,933,771 A | * | 8/1999 | Tiller et al. | 455/333 |
| 6,093,981 A | * | 7/2000 | Cali' et al. | 307/113 |
| 6,265,901 B1 | * | 7/2001 | Stern et al. | 326/126 |
| 6,307,442 B1 | | 10/2001 | Meyer et al. | |

(Continued)

OTHER PUBLICATIONS

European Search Report No. EP 05 42 5715.

(Continued)

*Primary Examiner* — Marceau Milord

(74) *Attorney, Agent, or Firm* — William J. Kubida; Peter J. Meza; Hogan Lovells US LLP

(57) ABSTRACT

A notch filter suitable for attenuating certain frequencies of a radio-frequency signal includes an input for receiving the radio-frequency signal and an output for the output of a portion of the radio-frequency signal, first and second capacitive means, at least one inductor and a negative resistance circuit suitable for compensating the resistive losses of said at least one inductor. The inductor and the first and second capacitive means are placed to produce a resonator and the filter comprises a control device suitable for controlling the negative resistance circuit. The input impedance of the filter comprises a pole and a zero, with the pole depending on the second capacitive means and the zero depending on both the first and second capacitive means. The first and second capacitive means are variable and the control device is suitable for controlling the first and second capacitive means.

20 Claims, 3 Drawing Sheets

U.S. PATENT DOCUMENTS

| | | | |
|---|---|---|---|
| 6,684,065 B2 * | 1/2004 | Bult et al. | 455/252.1 |
| 6,812,770 B2 * | 11/2004 | Filoramo et al. | 327/359 |
| 6,987,966 B1 * | 1/2006 | Wu et al. | 455/420 |
| 6,990,327 B2 * | 1/2006 | Zheng et al. | 455/307 |
| 7,132,861 B1 * | 11/2006 | Fu et al. | 327/52 |
| 7,142,042 B1 * | 11/2006 | Henry | 327/538 |
| 7,161,416 B2 * | 1/2007 | Gangi | 327/552 |
| 7,546,107 B2 * | 6/2009 | Noda et al. | 455/296 |
| 7,548,726 B1 * | 6/2009 | Rofougaran | 455/20 |
| 7,672,648 B1 * | 3/2010 | Groe et al. | 455/127.2 |
| 7,702,294 B2 * | 4/2010 | Granata | 455/78 |

OTHER PUBLICATIONS

Samavati et al. "A 5-GHz CMOS Wireless LAN Receiver Front End"; IEEE Journal of Solid-State Circuits; May 2000; pp. 765-772; vol. 35, No. 5.

Guo et al. "A Fully Integrated 900-MHz CMOS Wireless Receiver with On-Chip RF and IF Filters and 79-dB Image Rejection"; IEEE Journal of Solid-State Circuits; Aug. 2002; pp. 1084-1089; vol. 37, No. 8.

* cited by examiner

NOTCH FILTER AND APPARATUS FOR RECEIVING AND TRANSMITTING RADIO-FREQUENCY SIGNALS INCORPORATING SAME

RELATED APPLICATION

This application is a continuation of application Ser. No. 11/539,569, filed Oct. 6, 2006 and also claims priority of European Patent Application No. 05425715.9 filed Oct. 12, 2005, which are incorporated herein in their entirety by this reference.

FIELD OF THE INVENTION

The present invention herein refers to a notch filter, in particular to a filter that operates in radio-frequency, and to an apparatus for receiving and transmitting radio-frequency signals.

BACKGROUND OF THE INVENTION

Currently, with the development of wireless communications, there is a high market demand for receiver-transmitter devices suitable for transmitting and receiving a large quantity of data and equipped with a wide frequency band. Such transceivers must be integrated in a chip of semi-conductor material. For this reason various types of receivers like those with direct conversion have been produced that enable the problems in the traditional super heterodyne receivers to be overcome. The latter preferably comprise a band-pass filter, a low noise amplifier, a notch filter or notch filter and a mixer.

The sensitivity of the receivers can be degraded by spurious out-of-band signals due to various mechanisms. In superheterodyne receivers, the image signal has the same frequency deviation as the desired signal in regard to the clock of the local oscillator and has to be rejected. This operation can be facilitated through the use of a notch filter with programmable band, as the frequency of the image signal is known.

In some transceivers the signal transmission and reception circuits work simultaneously; the power of the transmitted signal is much higher than the power of the received signal and the insulation of the transmitted signal from the received signal is limited at the radio frequencies. In particular, if the receiver circuit is the type with direct conversion, its sensitivity can be greatly reduced by the lost fraction or leakage of the signal transmitted that overlaps the signal received. Considering the frequency of the transmitted signal, which can vary in accordance to the selected channel, is known, the rejection of the transmitted signal can be improved using a notch filter with programmable band.

Currently there are various transceiver devices that comprise a notch filter. However, such circuitry presents several inconveniences linked to the presence of noise during signal reception and to a limited accuracy of the frequency calibration.

The most common solution adopted to lessen the losses of the transmitted signal is to attenuate them at the input of the receiver or after the first amplification stage by using radio-frequency filters. Seeing the offset between the reception and transmission frequencies is rather low, the filters to use must be highly selective. These filters cannot be integrated into the same chip of the transceiver device, and the presence of the filters outside the chip of the transceiver device makes the solution very expensive, with a high consumption of energy.

In US Patent Application Publication No. 2004/0219900, a notch filter with high Q factor is described which is integrated with a first and a second low-noise amplifier and is totally contained in an integrated chip; said filter is suitable for the image rejection in radio-frequency applications. The notch filter comprises two Q factor enrichment circuits that are combined together to generate a negative impedance such that it compensates the losses in the low Q factor inductors located on the chip. To improve the image rejection the notch filter uses a circuit of automatic calibration of the current that consists of an analog multiplier.

SUMMARY OF THE INVENTION

In view of the state of the technique described, an object of the present invention is to provide a notch filter that is more accurate than the known filters and that permits lower consumption of energy.

In accordance with the present invention, this object is achieved by means of a notch filter suitable for attenuating certain frequencies of a radio-frequency signal, the filter including an input for receiving said radio-frequency signal and an output for the output of a portion of said radio-frequency signal, first and second capacitive means, at least one inductor and a negative resistance circuit suitable for compensating the resistive losses of said at least one inductor. The inductor and first and second capacitive means are arranged to produce a resonator. The filter further includes a control device for controlling the negative resistance circuit. The input impedance of the filter comprises a pole and a zero, with the pole depending on the second capacitive means and the zero depending on both the first and second capacitive means. The first and second capacitive means are variable and the control device is suitable for controlling said first and second capacitive means.

In an embodiment of the present invention, the notch filter can be regulated digitally so that the same filter can be adapted to time-varying signals. The filter is less selective than the known filters and thus can be integrated into the same chip of a transceiver apparatus.

The notch filter of the present invention may be incorporated in an apparatus for receiving and transmitting radio-frequency signals. The apparatus includes an antenna, a transmitter, a receiver, a duplexer operative for switching the signal to be transmitted towards the antenna and the signal received with the antenna towards the receiver. The receiver includes a first and second low-noise amplifiers and a notch filter of the present invention placed between the first and second amplifier.

BRIEF DESCRIPTION OF THE DRAWINGS

The characteristics and advantages of the present invention will appear evident from the following detailed description of an embodiment thereof, illustrated as non-limiting example in the enclosed drawings, in which.

DETAILED DESCRIPTION

Figure 1:
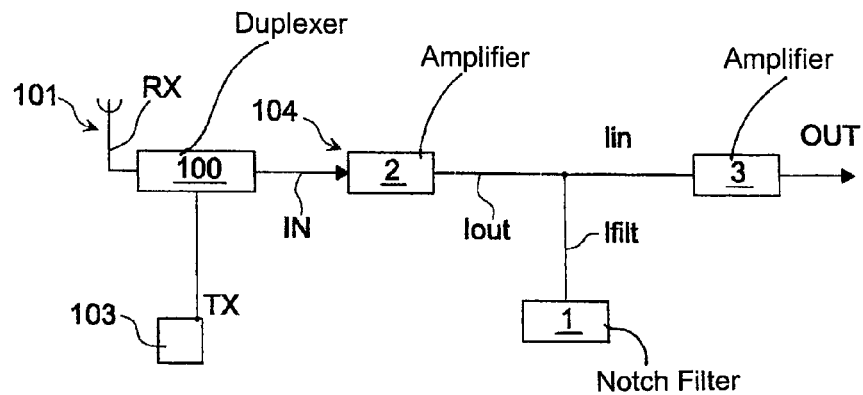
FIG. 1 is a block diagram of an apparatus for receiving and transmitting signals, wherein said receiving and transmitting apparatuses operate simultaneously.

FIG. 1 shows a diagram of an apparatus for receiving and transmitting radio-frequency signals comprising a notch filter according to the present invention. Said notch filter 1 is normally placed between a first amplifier 2 coupled to the radio-frequency input signal IN and a second amplifier 3 whose output signal OUT represents the radio-frequency output signal. The notch filter 1 belongs to the reception-transmission apparatus of radio-frequency signals; in said apparatus the radio-frequency input signal IN comprises the loss signal or leakage of the transmitted signal TX and said signal must be attenuated by the filter, as can be seen in FIG. 1. The signal receiving and transmitting apparatus comprises an antenna 101 for receiving the signal RX and for transmitting the signal TX, a transmitter 103 and a receiver 104, a duplexer 100 suitable for switching the transmitted signal TX towards the antenna and the signal RX towards the receiver 104; the latter comprises the amplifier 2, the filter 1 and the second amplifier 3. The signal IN therefore comprises the received signal RX and the loss signal of the transmitted signal TX.

Figure 2:
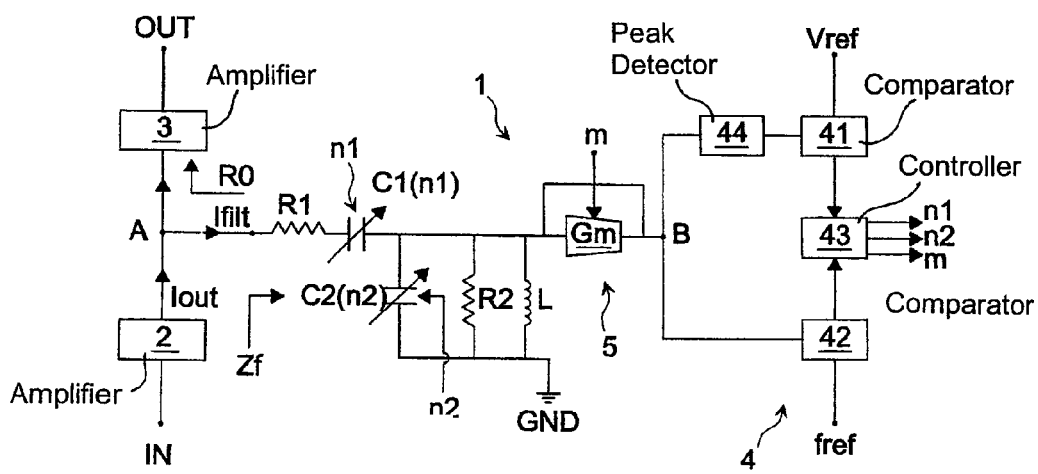
FIG. 2 is a block diagram of the notch filter according to the present invention.

The filter 1 is of programmable type and comprises a device 4 for calibrating the frequency and the Q factor, as can be seen in FIG. 2. The device 4 enables both the central frequency of the filter and the Q factor to be measured and adjusted without disconnecting the other circuits during the calibration phase. The filter comprises digital components that can be programmed to improve the linearity and to permit greater flexibility in controlling the frequency of the filter. The device 4 is capable of programming the filter to put it into self-oscillating conditions and to measure the frequency and the amplitude of said oscillation. By means of the relations between the oscillation frequency and the central frequency and between the oscillation amplitude and the Q factor the filter can be calibrated.

Figure 3:
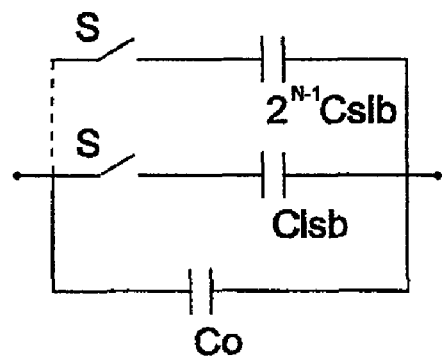
FIG. 3 is a diagram of an array of capacitors of the circuit of FIG. 2.

The filter 1 is coupled to the amplifier 2 so that the output current Iout of the amplifier 2 is subdivided into a current Ifilt in input to the filter 1 and a current Iin in input to the amplifier 3. The filter 2 comprises an inductor L coupled between input terminal A of the filter and ground GND, an array of programmable capacitors C1($n1$) coupled between the terminal A and a terminal of the inductor L, a resistor R1, that keeps track of the losses due to the array C1($n1$), placed between the inductor and the array C1($n1$), an array of programmable capacitors C2($n2$) placed in parallel to the inductor L, a resistance R2 placed in parallel to the inductor L and suitable for keeping track of the losses of the parallel between L and C2($n2$), and a negative resistance circuit 5 comprising a programmable transconductance amplifier Gm in positive feedback configuration having the task of cancelling the resistance R2. A possible implementation of a programmable array is shown in FIG. 3 where a fixed value capacitor Co is placed in parallel to N circuit branches, comprising a switch S and a variable capacitor with the value Clsb for the first branch (or branch 1) at the value $2^{N-1}$ Clsb for the last branch. In this case the array is controlled by a digital binary word and Clsb is the value of the capacitor with the least significant bit.

The output B of the transconductance amplifier Gm is in input to the device 4 suitable for programming the arrays C1($n1$) and C2($n2$) and the transconductance amplifier Gm. The device 4 comprises a peak detector 44 suitable for detecting the peak of the signal on the terminal B, an amplitude comparator 41 suitable for comparing the value of the amplitude of the signal coming from the peak detector 44 with the value of a reference voltage Vref, a frequency comparator 42 suitable for comparing the frequency of the signal on the terminal B with a reference frequency fief and a digital controller 43 having in input the outputs of the comparators 41 and 42 and sending in output the digital signals n1, n2 and m suitable for programming the arrays C1($n1$) and C2($n2$) and the transconductance amplifier Gm.

The calibration of the frequency comes about by increasing the value of the transconductance Gm to determine the oscillation of the components L, C1 and C2. The oscillation frequency is compared with the reference frequency fref by means of the comparator 42 and the value of the capacitive arrays C1 and C2 is adjusted by means of the digital data n1 and n2.

The calibration of the Q factor is done by comparison of the amplitude of the oscillations with the value of the voltage Vref; the value of the transconductance gain Gm is adjusted by means of the control word m.

Considering the resistance R2 exactly compensated the input impedance of the filter Zf has a localized pole-zero couple at the following angular frequencies:

$$\omega_z = \frac{1}{L(C1(n1) + C2(n2))} \quad \text{and} \quad \omega_p = \frac{1}{L \cdot C2}.$$

The input impedance of the filter is R1 at the angular frequency $\omega_z$; in this manner, given that the value of R1 is conceived to be negligible if compared with the value of the resistance Ro of the amplifier 3, the current Ifilt is much greater than the current Iin while the contrary comes about at the angular frequency $\omega_p$.

The angular frequency $\omega_z$ is the frequency of maximum attenuation of the notch filter 1 and corresponds to the frequency of the transmitted signal while the angular frequency $\omega_p$ determines the bandwidth of the filter. Said two angular frequencies can be programmed independently of each other by means of the control device 4. This permits high flexibility in controlling the frequency response of the filter. In fact during the phase of calibration of the angular frequencies $\omega_p$ and $\omega_z$ the ratio $\omega_p/\omega_z$ must not be changed for compensating the process variations and therefore the calibration of both the digital data n1 and n2 is necessary. Once the frequency $\omega_p$ that depends only on the capacitor C2($n2$) is fixed, only the digital data n1 could be adjusted to change the ratio $\omega_p/\omega_z$; in this manner it is possible to program the frequency of the notch filter independently from the frequency $\omega_p$.

The calibration procedure comes about in the following manner. Initially the calibration of the gain Gm comes about. The value of the transconductance gain Gm is increased to start up the oscillation of the parallel resonator composed of three branches: the inductor L, the capacitance C2($n2$) and the branch composed of the resistances Ro and R1 and of the capacitance C1($n1$). The datum or digital word m, that sets the value of the transconductance gain Gm, is regulated by detecting the amplitude of the oscillation and comparing it with the value of the reference voltage Vref. Said operation is carried out by means of the peak detector 44, the comparator 41 and the digital controller 43.

The latter comprises a processor suitable for carrying out the activity of the digital controller 43 by means of the following operations. During the filter calibration phase the processor searches among the digital codes n1, n2 and m those that enable the frequency and the oscillation amplitude desired to be obtained. The calibration phase can be made only for the central transmission frequency or alternatively repeated for every possible transmission frequency. The final code is stored in an internal memory to be accessible in the following phases. During the normal operation of the filter, the processor processes the correct codes n1, n2 and m to supply them to the filter. Said processing is based on the stored calibration codes and on the transmitted channel code that is supplied in input to the processor.

The oscillation frequency is compared with the reference frequency fref and the capacitive arrays C1 (n1) and C2 (n2) are adjusted in accordance with the result of the comparison, until the frequency error is made minimum. Considering that it is necessary to impose the ratio $\omega_p/\omega_z$, between the angular frequencies of the pole and of the zero constant, the datum or digital word for controlling the capacitances C1 and C2 must be equal, that is n1=n2=n. Said operations are carried out by the comparator 42 and by the digital controller 43.

The oscillation frequency coincides with the central frequency of the filter; once the oscillation frequency is fixed the pole and the zero of the filter, that is the band-pass and the attenuation band of the filter 1, are also fixed. However, after the filter calibration phase, it is possible to vary only the digital word n1 to vary the position of the zero, should transmitted channel variations be present that move the frequency of the loss signal of the transmitted signal.

Figure 4:
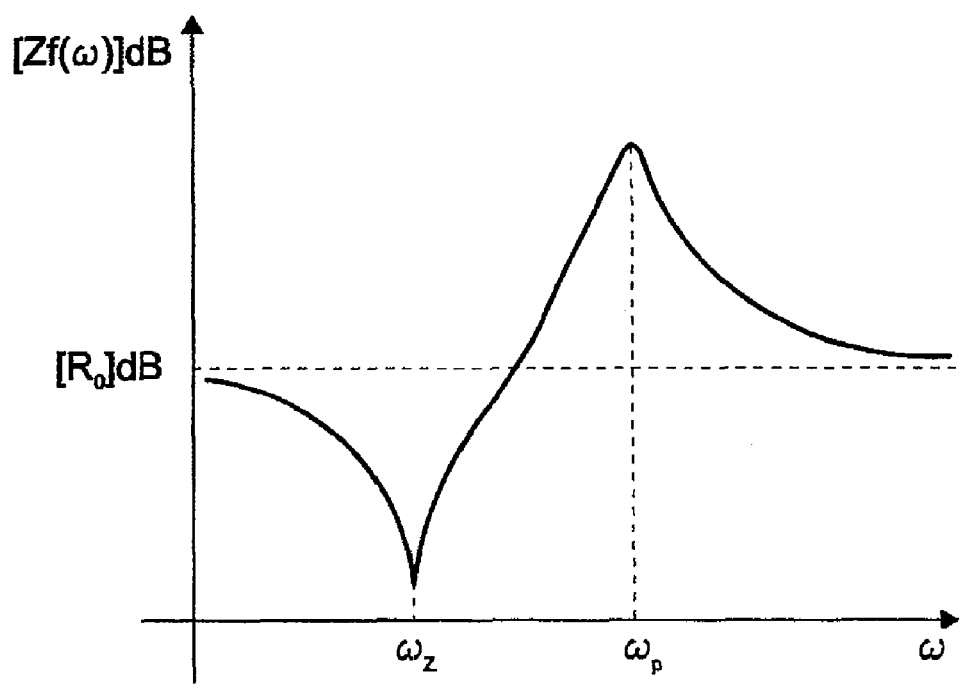
FIG. 4 is a diagram of the input impedance as a function of the frequency.

FIG. 4 shows the trend of the input impedance of the filter Zf in absolute value in function of the angular frequency; it can be seen from the graph that the impedance Zf has the minimum coinciding with the zero $\omega_z$ and the maximum coinciding with the pole $\omega_p$.

Considering the circuit of FIG. 2, the equivalent capacitance C1p of the series of components Ro, R1 and C1 can be calculated. We have:

$$C1p = \frac{C1}{1 + [\omega_z(Ro + R1)C1]^2}$$

which is slightly lower than the value of C1. This determines an error for the frequency associated to the zero given that:

$$\left|\frac{\Delta fz}{fz}\right| = \frac{1}{2}\frac{1}{1 + C2/C1}\left|\frac{C1 - C1p}{C1}\right| \approx \frac{1}{2}\frac{1}{1 + C2/C1}[\omega_z(Ro + R1)C1]^2.$$

Therefore the error on the frequency associated to the zero can be made small by reducing the time constant (R0+R1)C1.

Calculating the equivalent resistance R1p of the series of the elements Ro, R1 and C1 we have:

R1p≈(Ro+R1)[$\omega_z$(Ro+R1)C1]$^{-2}$ and therefore to keep the oscillation the transconductance gain must be Gmosc=−(R2+R1p)/(R2*R1p) where Gmosc is the transconductance gain in oscillation conditions. The ratio r between the transconductance gain Gmosc and the transconductance gain of the filter Gm=−1/R2 must be:

$$r \approx \frac{R2}{Ro + R1}[\omega_z(Ro + R1)C1]^2 + 1.$$

In typical applications r varies between 1.5 and 2. The ratio r is mainly subject to variations of the Q factor of the inductor, of the input impedance of the second amplifier Ro and of the capacitance C1; said variations can be controlled satisfactorily permitting an accuracy of the ratio r equal to 10%.

To find the word m that controls the transconductance gain Gm, the amplitude of the oscillation must be made equal to the value Vref. The latter must be equal to the amplitude of the signal in input to the transconductance amplifier when the input current Ifilt is at the maximum value during the normal operation of the filter. This enables the ratio r also found in high-level signal conditions to be made valid.

Figure 5:
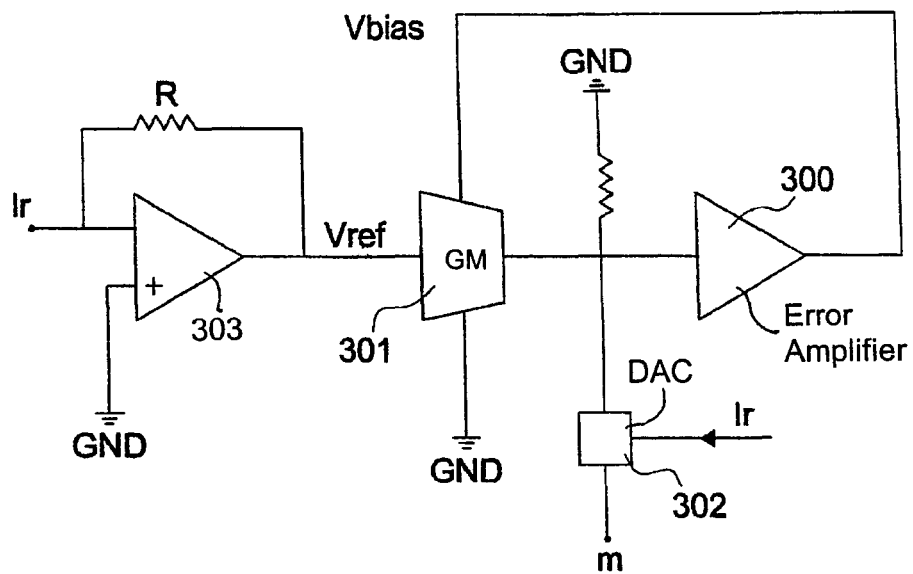
FIG. 5 is a circuit that implements a linear dependence of the trans-conductance gain on a digital word.

The ratio "r" can be simply implemented by a digital control circuit if the dependence of the transconductance gain Gm on the word m is linear. A circuit that produces said linear dependence of Gm on m is shown in FIG. 5. A transconductance amplifier 301 has a gain given by Gm/K where K is a constant. The amplifier 301 is coupled to ground GND and has in input the voltage Vref; the output of the amplifier 301 is the input of an error amplifier 300 at high gain which, by means of the voltage Vbias, forces the output current of the amplifier 301 to be equal to Idac, that is the output current of a digital-analog converter 302 controlled by the word m. The reference voltage Vref is the output voltage of an operational amplifier 303 having in input on the inverting terminal the current Ir, the non-inverting terminal coupled to ground and the output terminal coupled to the inverting terminal by means of a resistance R. The digital-analog converter 302 has the reference current Ir in input and the terminal on which the current Idac flows is coupled to ground GND by means of the resistance Rc. We have:

$$Idac = Vref\frac{Gm}{K} = R \times Ir \times \frac{Gm}{K}. \text{ If } Idac = m^*Ir \text{ we have } Gm = m\frac{K}{R}.$$

The voltage Vbias is applied to a replica of the circuit 301 that has to be K times greater and comprises circuit 5 of FIG. 2.

Figure 6:
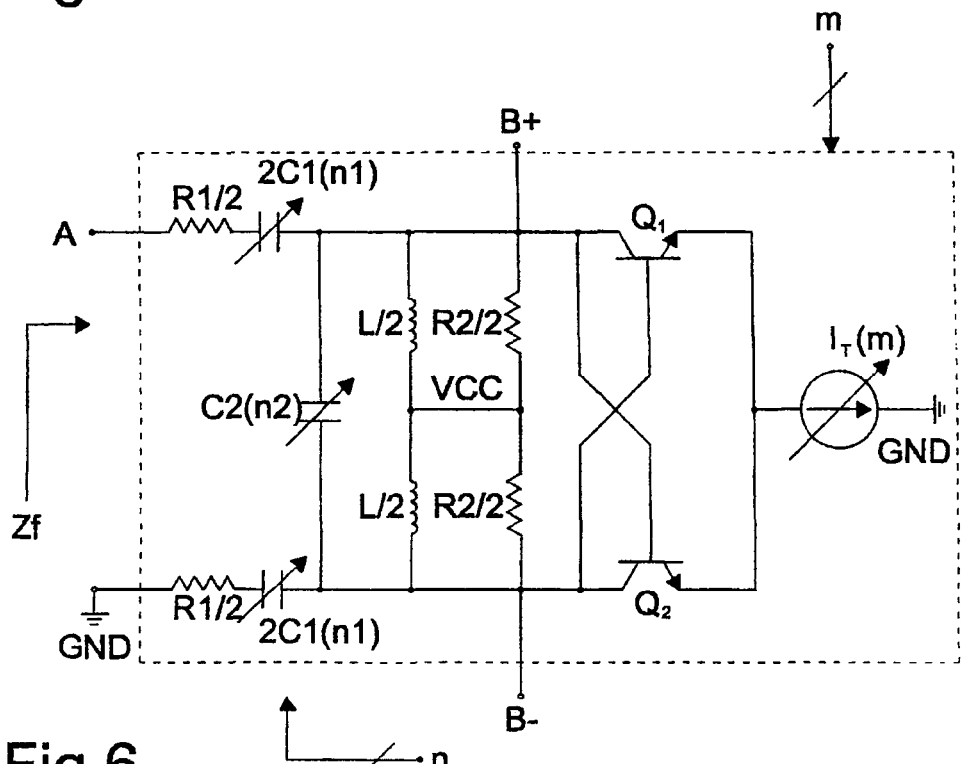
FIG. 6 is a more detailed circuit diagram of a part of the filter of FIG. 2.

A circuit implementation of a part of the notch filter of FIG. 1 is shown in FIG. 6. The negative impedance circuit 5 is produced by means of a couple of differential bipolar cross-coupled transistors Q1 and Q2; the cross coupling produces the positive feedback needed to generate a negative impedance. The emitter terminals of the transistors Q1 and Q2 are coupled to a current generator It(m), coupled in turn to ground GND, that can depend directly on the digital word m or indirectly by means of the circuit described in FIG. 5. Both the inductor L and the capacitor C1(n1) are divided respectively into two inductors of the value L/2 and two capacitors of the value 2*C1(n1), while the parasitic resistances R1 and R2 are also halved. The common terminal of the inductors L/2 is coupled to a positive supply for the polarization of the circuit 5. The output voltage of the parallel resonator formed by the branches L, C2(n2), and the series of the components Ro, R1 and C1(n1) must be considered as a differential output voltage between the nodes B+ and B− which is in input to the control device 4.

While there have been described above the principles of the present invention in conjunction with specific memory architectures and methods of operation, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicant hereby reserves the right to formulate new claims to such features and/or combinations of such features during the prosecution of the present application or of any further application derived therefrom.

I claim:

1. A notch filter comprising:
   an input/output terminal;
   first and second variable capacitor circuits coupled to the input/output terminal, and having an intermediate node;
   a variable gain transconductance amplifier having an input coupled to the intermediate node, and an output;
   a peak detector having an input coupled to the output of the transconductance amplifier, and an output;
   a first comparator having a first input coupled to the output of the peak detector, a second input for receiving a reference voltage, and an output;
   a second comparator having a first input coupled to the output of the transconductance amplifier, a second input for receiving a reference frequency, and an output; and
   a control circuit having inputs coupled to the output of the first comparator and the second comparator, and outputs for controlling the first and second variable capacitor circuits and the transconductance amplifier.

2. The notch filter of claim 1 wherein the first variable capacitor circuit comprises a switchable capacitor array.

3. The notch filter of claim 1 wherein the second variable capacitor circuit comprises a switchable capacitor array.

4. The notch filter of claim 1 wherein the variable gain transconductance amplifier comprises a transconductance amplifier coupled to an error amplifier.

5. The notch filter of claim 1 wherein the variable gain transconductance amplifier comprises a DAC.

6. The notch filter of claim 1 wherein the first comparator comprises a voltage comparator.

7. The notch filter of claim 1 wherein the second comparator comprises a frequency comparator.

8. The notch filter of claim 1 further comprising an inductor in parallel with the second variable capacitor circuit.

9. The notch filter of claim 1 further comprising a resistor in series with the first variable capacitor circuit.

10. The notch filter of claim 1 further comprising a resistor in parallel with the second variable capacitor circuit.

11. A notch filter comprising:
    first, second, and third terminals;
    a first variable capacitor circuit coupled between the first and second terminals;
    a second variable capacitor circuit coupled between the second terminal and ground;
    a variable gain transconductance circuit coupled between the second and third terminals;
    a peak detector coupled to the variable gain transconductance circuit;
    a first comparator coupled to the peak detector;
    a second comparator coupled to the variable gain transconductance circuit; and
    a control circuit coupled to the first comparator and second comparator for controlling the first and second variable capacitor circuits and the variable transconductance circuit.

12. The notch filter of claim 11 wherein the first variable capacitor circuit comprises a switchable capacitor array.

13. The notch filter of claim 11 wherein the second variable capacitor circuit comprises a switchable capacitor array.

14. The notch filter of claim 11 wherein the variable gain transconductance circuit comprises a transconductance amplifier coupled to an error amplifier.

15. The notch filter of claim 11 wherein the variable gain transconductance amplifier comprises a DAC.

16. The notch filter of claim 11 wherein the first comparator comprises a voltage comparator.

17. The notch filter of claim 11 wherein the second comparator comprises a frequency comparator.

18. The notch filter of claim 11 further comprising an inductor in parallel with the second variable capacitor circuit.

19. The notch filter of claim 11 further comprising a resistor in series with the first variable capacitor circuit.

20. The notch filter of claim 11 further comprising a resistor in parallel with the second variable capacitor circuit.

* * * * *

UNITED STATES PATENT AND TRADEMARK OFFICE
CERTIFICATE OF CORRECTION

| | | |
|---|---|---|
| PATENT NO. | : 7,983,625 B2 | Page 1 of 1 |
| APPLICATION NO. | : 12/762203 | |
| DATED | : July 19, 2011 | |
| INVENTOR(S) | : Angelo Granata | |

It is certified that error appears in the above-identified patent and that said Letters Patent is hereby corrected as shown below:

Title Page, Item (75) Inventor: "Syracuse" should be --Siracusa--

Signed and Sealed this
Eighteenth Day of October, 2011

David J. Kappos
*Director of the United States Patent and Trademark Office*